(12) United States Patent
Sakaino et al.

(10) Patent No.: US 10,784,649 B2
(45) Date of Patent: Sep. 22, 2020

(54) OPTICAL SEMICONDUCTOR DEVICE

(71) Applicant: Mitsubishi Electric Corporation, Tokyo (JP)

(72) Inventors: Go Sakaino, Tokyo (JP); Naoki Nakamura, Tokyo (JP); Yuichiro Okunuki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/474,344

(22) PCT Filed: Mar. 23, 2017

(86) PCT No.: PCT/JP2017/011825
§ 371 (c)(1),
(2) Date: Jun. 27, 2019

(87) PCT Pub. No.: WO2018/173215
PCT Pub. Date: Sep. 27, 2018

(65) Prior Publication Data
US 2020/0083671 A1    Mar. 12, 2020

(51) Int. Cl.
*H01S 5/00*    (2006.01)
*H01S 5/042*    (2006.01)
(Continued)

(52) U.S. Cl.
CPC ........ *H01S 5/04256* (2019.08); *H01S 5/0425* (2013.01); *H01S 5/06258* (2013.01);
(Continued)

(58) Field of Classification Search
CPC .... H01S 5/0425; H01S 5/2018; H01S 5/2222; H01S 5/04256; H01S 5/06258; H01S 5/323; H01S 5/343; H01S 5/34366
See application file for complete search history.

(56) References Cited

U.S. PATENT DOCUMENTS 5,394,421 A    2/1995    Ikawa et al.
9,647,425 B1 *  5/2017    Nakamura ............. H01S 5/026
(Continued)

FOREIGN PATENT DOCUMENTS

JP    S63-084087 A    4/1988
JP    H03-208390 A    9/1991
(Continued)

OTHER PUBLICATIONS

International Search Report; Written Opinion; and Notification of Transmittal of the International Search Report and the Written Opinion of the International Searching Authority, or the Declaration issued in PCT/JP2017/011825; dated Jun. 6, 2017.

*Primary Examiner* — Kinam Park
(74) *Attorney, Agent, or Firm* — Studebaker & Brackett PC

(57) ABSTRACT

A semiconductor laser (2) includes an n-type semiconductor substrate (1), a stack of an n-type cladding layer (4), an active layer (5), and a p-type cladding layer (6) successively stacked on the n-type semiconductor substrate (1). An optical waveguide (3) includes a non-impurity-doped core layer (9) provided on a light output side of the semiconductor laser (2) on the n-type semiconductor substrate (1) and having a larger forbidden band width than the active layer (5), and a cladding layer (10) provided on the core layer (9) and having a lower carrier concentration than the p-type cladding layer (6). The semiconductor laser (2) includes a carrier injection region (X1), and a non-carrier-injection region (X2) provided between the carrier injection region (X1) and the optical waveguide (3).

9 Claims, 13 Drawing Sheets

(51) Int. Cl.
  *H01S 5/20* (2006.01)
  *H01S 5/0625* (2006.01)
  *H01S 5/22* (2006.01)
  H01S 5/343 (2006.01)
  H01S 5/323 (2006.01)

(52) U.S. Cl.
  CPC .......... *H01S 5/2018* (2013.01); *H01S 5/2222* (2013.01); *H01S 5/323* (2013.01); *H01S 5/343* (2013.01); *H01S 5/34366* (2013.01)

(56) References Cited

U.S. PATENT DOCUMENTS

2002/0159492 A1* 10/2002 Yamamura .............. H01S 5/164
  372/46.01
2010/0189146 A1* 7/2010 Bessho ................ H04N 9/3161
  372/43.01
2019/0285975 A1* 9/2019 Fujii .................. G03B 21/2053

FOREIGN PATENT DOCUMENTS

| JP | H06-260715 A | 9/1994 |
| JP | H07-058402 A | 3/1995 |
| JP | 2002-261379 A | 9/2002 |
| JP | 2003-142774 A | 5/2003 |
| JP | 2016-152360 A | 8/2016 |

* cited by examiner

OPTICAL SEMICONDUCTOR DEVICE

FIELD

The present invention relates to an optical semiconductor device where a semiconductor laser and an optical waveguide are integrated, and in particular to an optical semiconductor device configured to have improved characteristics by reducing unevenness of carrier density in the active layer.

BACKGROUND

Development of smaller, higher performance optical semiconductor devices has progressed through integrating semiconductor lasers with optical waveguides, optical multiplexers or modulators, and so on. For such integrated optical semiconductor devices, it is crucial to effectively inject carriers into a semiconductor laser that contributes to emission of light to achieve a sufficient light-emitting efficiency. It is thus beneficial to ensure that no carrier is injected to the optical waveguide, which is a component other than the semiconductor laser. On the other hand, uniform injection of carriers to an active layer of the semiconductor laser allows favorable characteristics with a low threshold current to be achieved.

Optical semiconductor devices for optical communications require a structure where a semiconductor laser is integrated with an optical multiplexer and the like, as noted above. Such an integrated optical semiconductor device needs an optical waveguide for guiding the light emitted from the semiconductor laser. One end of the semiconductor laser and one end of the optical waveguide are joined together to form a butt-joint.

The optical waveguide is not doped with impurities to avoid absorption of light, so that no carriers are injected into the optical waveguide. Therefore, electrons supplied from an area below the optical waveguide are diverted and introduced into the active layer. These diverted electrons are concentrated at about several μm from the butt-joint, in particular. Presence of such a locally extremely high electron density in the active layer leads to insufficient supply of holes that contribute to emission of light, which causes an increase in the threshold current required in the semiconductor laser for laser oscillation. Heat generation by nonradiative recombination also rises, and the increased operating current leads to a higher power consumption or degradation of modulation characteristics.

Methods of reducing destruction or degradation of a light-emitting end face of a semiconductor laser wherein an active layer is formed as far as to the end face of the device have been proposed (see, for example, PTL 1 and PTL 2). Carriers are injected to end face regions when the active layer is present as far as to the end face, but such carrier injection to end face portions can be reduced by removing a layer injected with carriers above the active layer, or by forming a p-type semiconductor layer below the active layer. There have been proposed other methods wherein impurities are introduced to an end portion of an active layer to form a window structure in an optical semiconductor device so as to prevent destruction or degradation of the end portion caused by absorption of light in the end portion (see, for example, PTL 3 to PTL 5). However, doped window structures are quite different from non-doped optical waveguides.

The phenomenon of locally increased carrier density has been disclosed (see, for example, PTL 6), wherein the carrier density inside an electrode on an upper surface of a device facing a semiconductor substrate is mentioned. However, the problem of the local increase of carrier density in the active layer that adversely affects device characteristics and methods of resolving this problem have not been disclosed so far.

CITATION LIST

Patent Literature

[PTL1] Japanese Patent Application Laid-open No. 06-260715
[PTL2] Japanese Patent Application Laid-open No. S63-084087
[PTL3] Japanese Patent Application Laid-open No. H07-058402
[PTL4] Japanese Patent Application Laid-open No. 2003-142774
[PTL5] Japanese Patent Application Laid-open No. H03-208390
[PTL6] Japanese Patent Application Laid-open No. 2002-261379

SUMMARY

Technical Problem

Optical semiconductor devices with a semiconductor laser and an optical waveguide integrated therein entailed a problem that locally high carrier densities present in the active layer would cause a decline in the device characteristics. Reducing such unevenness of carrier density in the active layer will lead to improved characteristics such as threshold current.

The present invention was made to solve the problems described above and its object is to provide an optical semiconductor device configured to have improved characteristics by reducing unevenness of carrier density in the active layer.

Solution to Problem

An optical semiconductor device according to the present invention includes: a semiconductor laser including an n-type semiconductor substrate, a stack of an n-type cladding layer, an active layer, and a p-type cladding layer successively stacked on the n-type semiconductor substrate; and an optical waveguide including a non-impurity-doped core layer provided on a light output side of the semiconductor laser on the n-type semiconductor substrate and having a larger forbidden band width than the active layer, and a cladding layer provided on the core layer and having a lower carrier concentration than the p-type cladding layer, wherein the semiconductor laser includes a carrier injection region, and a non-carrier-injection region provided between the carrier injection region and the optical waveguide.

Advantageous Effects of Invention

In the present invention, no carriers are injected from the underside of the n-type semiconductor substrate in the non-carrier-injection region and the optical waveguide. Thus a flow of electrons diverted from beneath the non-carrier-injection region and the optical waveguide to the carrier injection region side of the active layer can be suppressed.

As a result, the unevenness of carrier density in the active layer is reduced and the characteristics can be improved.

DESCRIPTION OF EMBODIMENTS

An optical semiconductor device according to the embodiments of the present invention will be described with reference to the drawings. The same components will be denoted by the same symbols, and the repeated description thereof may be omitted.

Embodiment 1

Figure 1:
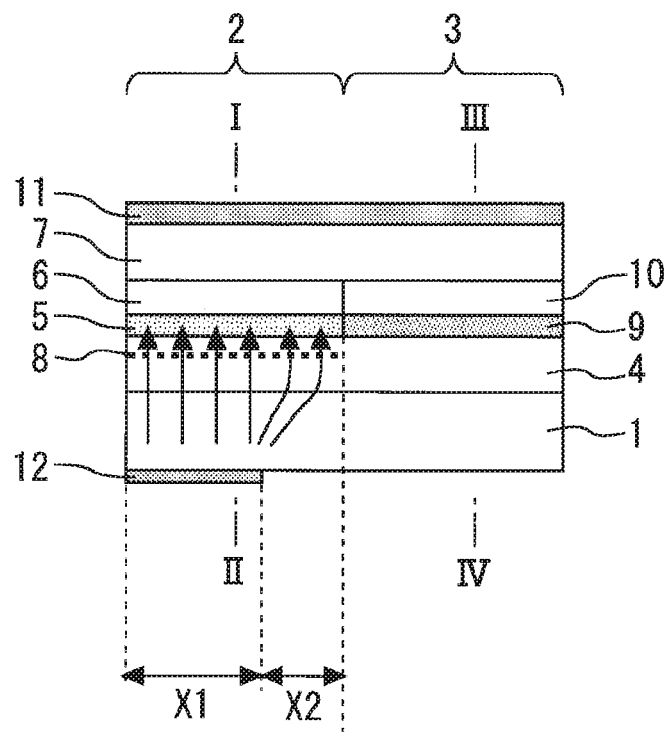
FIG. 1 is a cross-sectional view illustrating an optical semiconductor device according to Embodiment 1 of the present invention.

FIG. 1 is a cross-sectional view illustrating an optical semiconductor device according to Embodiment 1 of the present invention. FIG. 1 is a cross-sectional view along a direction parallel to a laser beam propagation direction, i.e., a resonator direction. The optical semiconductor device according to this embodiment is an integrated optical semiconductor device having a semiconductor laser 2 and an optical waveguide 3 integrated on an n-type InP substrate 1. The optical waveguide 3 is provided on a light output side of the semiconductor laser 2.

The semiconductor laser 2 includes the n-type InP substrate 1, and a stack of an n-type cladding layer 4, an active layer 5, a p-type cladding layer 6, and a conductive InP layer 7 successively stacked on the substrate. A diffraction grating 8 is provided inside the n-type cladding layer 4, i.e., the semiconductor laser 2 is a distributed feedback semiconductor laser. The n-type cladding layer 4 is an n-type InP cladding layer with a carrier concentration of $1\times10^{18}$ cm$^{-3}$. The active layer 5 is an AlGaInAs strained quantum well active layer. The p-type cladding layer 6 is a p-type InP cladding layer with a carrier concentration of $1\times10^{18}$ cm$^{-3}$. The conductive InP layer 7 is a p-type InP cladding layer with a carrier concentration of $1\times10^{18}$ cm$^{-3}$. The active layer 5 has a thickness of 0.2 µm, and the p-type cladding layer 6 has a thickness of 0.2 µm, for example.

The optical waveguide 3 includes the n-type InP substrate 1, and a stack of the n-type cladding layer 4, a core layer 9, a cladding layer 10, and the conductive InP layer 7 successively stacked on the substrate. The core layer 9 is a non-impurity-doped InGaAsP layer having a larger forbidden band width than the active layer 5. The core layer 9 has a thickness of 0.2 µm, for example. An end face of the active layer 5 of the semiconductor laser 2 and an end face of the core layer 9 of the optical waveguide 3 are joined together to form a butt-joint. The cladding layer 10 is an InP layer with a carrier concentration of not more than $1\times10^{17}$ cm$^{-3}$, and has a higher electrical resistance than the p-type cladding layer 6 of the semiconductor laser 2 because of the lower carrier concentration.

A p-type electrode 11 is provided on the conductive InP layer 7. An n-type electrode 12 is provided under the n-type InP substrate 1. The semiconductor laser 2 includes a carrier injection region X1, and a non-carrier-injection region X2 provided between the carrier injection region X1 and the optical waveguide 3. Namely, the non-carrier-injection region X2 is positioned close to the optical waveguide 3. The carrier injection region X1 is spaced away from the butt-joint by the width of the non-carrier-injection region X2. The non-carrier-injection region X2 has a width of 50 µm or more.

Figure 2:
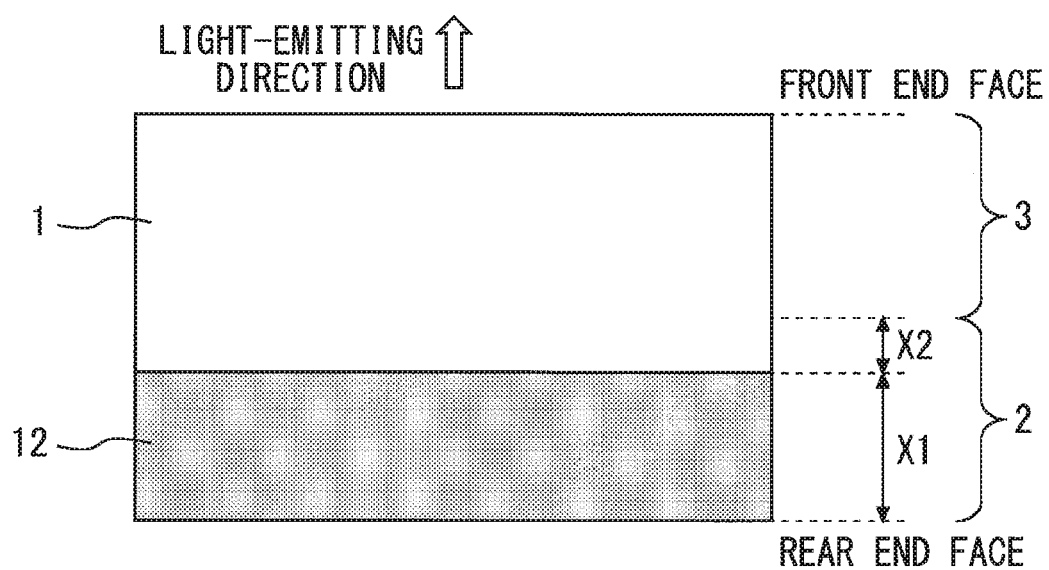
FIG. 2 is a bottom view illustrating the optical semiconductor device according to Embodiment 1 of the present invention.

FIG. 2 is a bottom view illustrating the optical semiconductor device according to Embodiment 1 of the present invention. The n-type electrode 12 is provided only in the carrier injection region X1, and not in the non-carrier-injection region X2 and the optical waveguide 3. One end of the n-type electrode 12 facing the optical waveguide 3 is located 50 µm from the butt-joint, while the opposite end coincides with the end of the semiconductor laser 2. Therefore, carriers are injected into the active layer 5 from the underside of the n-type semiconductor substrate 1 in the carrier injection region X1, and no carriers are injected from the underside of the n-type semiconductor substrate 1 in the non-carrier-injection region X2 and the optical waveguide 3.

Figure 3:
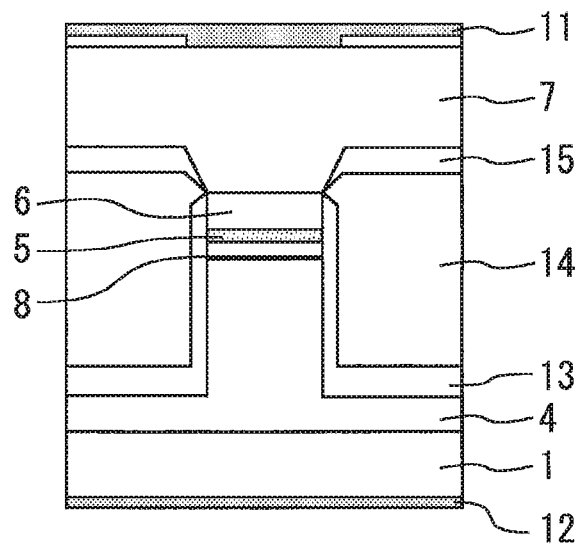
FIG. 3 is a cross-sectional view taken along I-II of FIG. 1.

FIG. 3 is a cross-sectional view taken along I-II of FIG. 1. That is, FIG. 3 is a cross-sectional view of the semiconductor laser 2 cut perpendicularly to the resonator direction. The active layer 5 and others of the semiconductor laser 2 are processed to have a mesa stripe geometry. Both sides of the mesa stripe are buried by a p-type InP buried layer 13 with a carrier concentration of $1\times10^{18}$ cm$^{-3}$, an Fe-doped InP buried layer 14 with a carrier concentration of $5\times10^{16}$ cm$^{-3}$, and an n-type InP buried layer 15 with a carrier concentration of $5\times10^{18}$ cm$^{-3}$.

Figure 4:
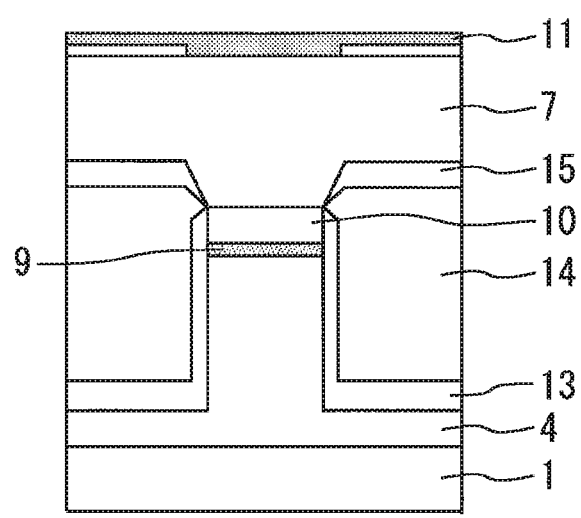
FIG. 4 is a cross-sectional view taken along III-IV of FIG. 1.

FIG. 4 is a cross-sectional view taken along II-IV of FIG. 1. That is, FIG. 4 is a cross-sectional view of the optical waveguide 3 cut perpendicularly to the resonator direction. The core layer 9 and others of the optical waveguide 3 are processed to have a mesa stripe geometry. Both sides of the mesa stripe are buried by the p-type InP buried layer 13, Fe-doped InP buried layer 14, and n-type InP buried layer 15 similarly to the semiconductor laser 2.

Next, a method for manufacturing the optical semiconductor device according to Embodiment 1 will be described. FIG. 5 to FIG. 12 are cross-sectional views illustrating the manufacturing steps of the optical semiconductor device according to Embodiment 1 of the present invention. FIG. 8 to FIG. 11 are cross-sectional views taken along I-II of FIG. 7, i.e., cross-sectional views of a portion where the semiconductor laser 2 is formed cut perpendicularly to the resonator direction.

Figure 5:
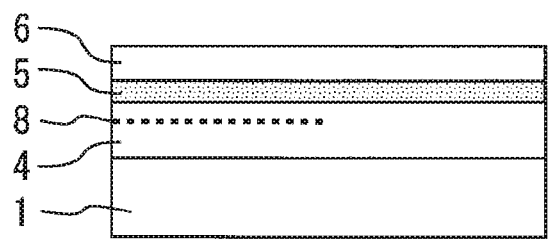
FIG. 5 is a cross-sectional view illustrating the manufacturing step of the optical semiconductor device according to Embodiment 1 of the present invention.

First, as shown in FIG. 5, a crystal of n-type cladding layer 4 is grown by an MOCVD process on the n-type InP substrate 1. After forming the diffraction grating 8 by electron beam exposure, the n-type cladding layer 4 is regrown. Crystals of active layer 5 and p-type cladding layer 6 are successively grown on the n-type cladding layer 4.

Figure 6:
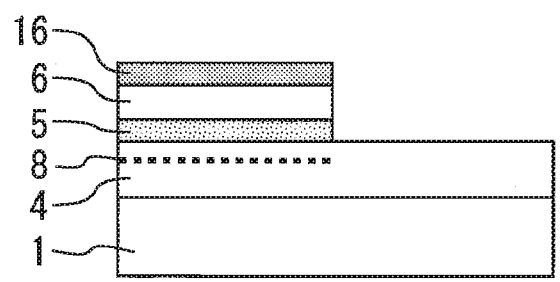
FIG. 6 is a cross-sectional view illustrating the manufacturing step of the optical semiconductor device according to Embodiment 1 of the present invention.
Figure 7:
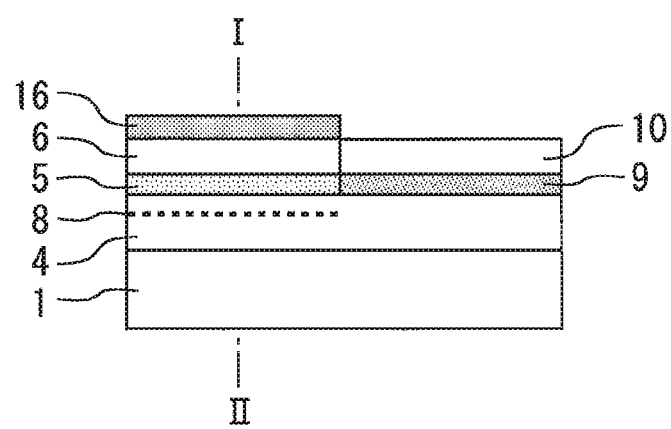
FIG. 7 is a cross-sectional view illustrating the manufacturing step of the optical semiconductor device according to Embodiment 1 of the present invention.

Next, as shown in FIG. 6, an SiO$_2$ insulating film 16 is formed on the p-type cladding layer 6, and the portion on the right side of the drawing of the active layer 5 and p-type cladding layer 6 is removed through patterning and dry etching. Crystals of core layer 9 and cladding layer 10 are then successively grown by an MOCVD process in the portion removed by etching as shown in FIG. 7. After that, the SiO$_2$ insulating film 16 is removed by etching.

Figure 8:
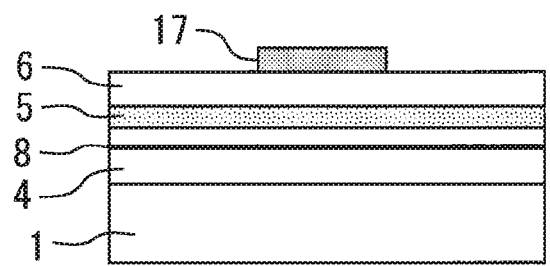
FIG. 8 is a cross-sectional view illustrating the manufacturing step of the optical semiconductor device according to Embodiment 1 of the present invention.
Figure 9:
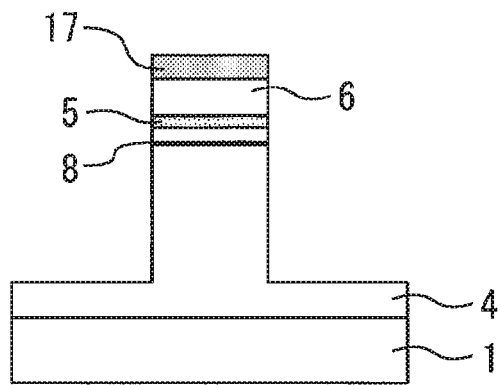
FIG. 9 is a cross-sectional view illustrating the manufacturing step of the optical semiconductor device according to Embodiment 1 of the present invention.
Figure 10:
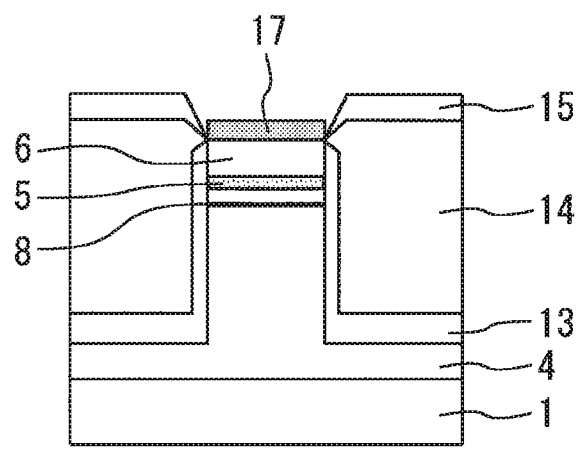
FIG. 10 is a cross-sectional view illustrating the manufacturing step of the optical semiconductor device according to Embodiment 1 of the present invention.
Figure 11:
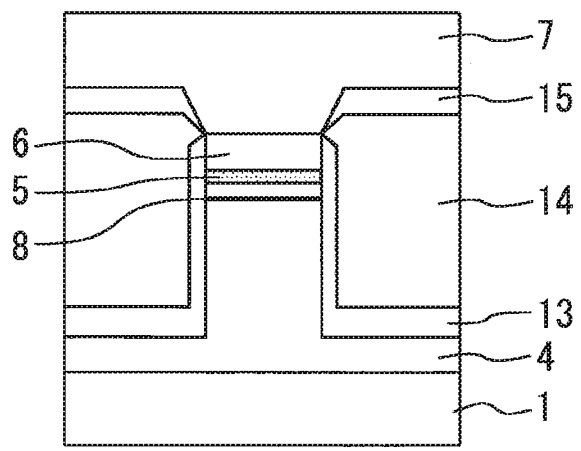
FIG. 11 is a cross-sectional view illustrating the manufacturing step of the optical semiconductor device according to Embodiment 1 of the present invention.

Next, as shown in FIG. 8, an SiO$_2$ insulating film 17 is formed and patterned. Next, the semiconductor layers are processed with dry etching and the like to provide a mesa stripe geometry as shown in FIG. 9. Next, the p-type InP buried layer 13, Fe-doped InP buried layer 14, and n-type InP buried layer 15 are grown by an MOCVD process as shown in FIG. 10. After that, the SiO$_2$ insulating film 17 is removed by etching. Next, the conductive InP layer 7 is grown by an MOCVD process as shown in FIG. 11.

Figure 12:
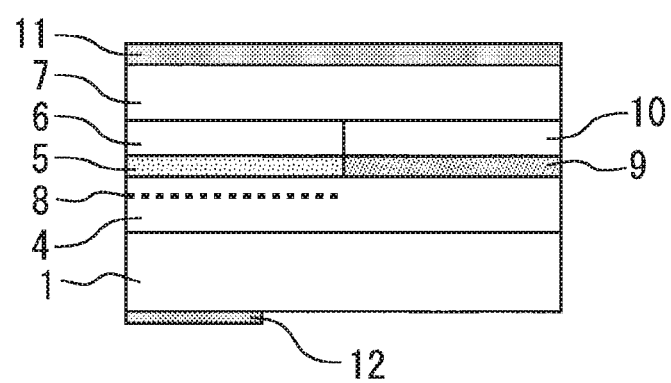
FIG. 12 is a cross-sectional view illustrating the manufacturing step of the optical semiconductor device according to Embodiment 1 of the present invention.

Next, a Ti/Pt/Au p-type electrode 11 is formed as shown in FIG. 12. Further, a Ti/Pt/Au n-type electrode 12 is formed. This can be achieved for example by forming the n-type electrode 12 on the entire backside of the substrate, and by removing the non-carrier-injection region X2 and the optical waveguide 3 portions of the n-type electrode 12 through ion milling or the like using a resist or the like. Alternatively, a lift-off process may be performed using a resist or the like. The optical semiconductor device according to this embodiment is manufactured through the processes described above.

The n-type electrode 12 of the thus produced optical semiconductor device is fixed to a package using a conductive bonding material such as solder. The p-type electrode 11 is wire-bonded. A voltage applied across the n-type electrode 12 and the p-type electrode 11 causes a current to flow successively through the conductive InP layer 7, the p-type cladding layer 6, and the active layer 5, whereupon a laser beam is emitted from the active layer 5. This laser beam propagates through the core layer 9 toward the right side of FIG. 1.

Figure 13:
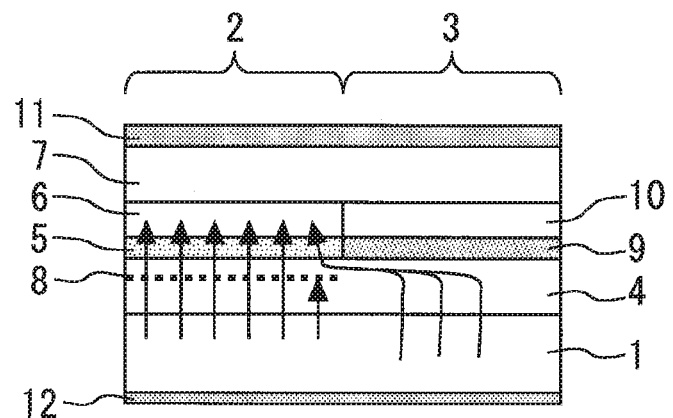
FIG. 13 is a cross-sectional view illustrating a semiconductor optical device according to the comparative example.

Next, the effects of this embodiment will be explained in comparison to a comparative example. FIG. 13 is a cross-sectional view illustrating a semiconductor optical device according to the comparative example. In the comparative example, the n-type electrode 12 is formed on the entire lower surface of the n-type InP substrate 1. Electrons, which are carriers, are injected into the active layer 5 from the n-type electrode 12. The electrons injected from the n-type electrode 12 to below the optical waveguide 3 detour the core layer 9 that does not pass electrons, flowing under the core layer 9 and into the active layer 5. These diverted electrons concentrate in a portion of the active layer 5 spaced away about 3 µm from the butt-joint of the active layer 5, which results in deterioration of characteristics.

In contrast, the n-type electrode 12 is provided only in the carrier injection region X1 and not in the non-carrier-injection region X2 and the optical waveguide 3 in this embodiment. Therefore, no carriers are injected from the underside of the n-type semiconductor substrate 1 in the non-carrier-injection region X2 and the optical waveguide 3. Thus a flow of electrons diverted from beneath the non-carrier-injection region X2 and the optical waveguide 3 to the carrier injection region X1 side of the active layer 5 can be suppressed. As a result, the unevenness of carrier density in the active layer 5 is reduced and the characteristics can be improved.

Figure 14:
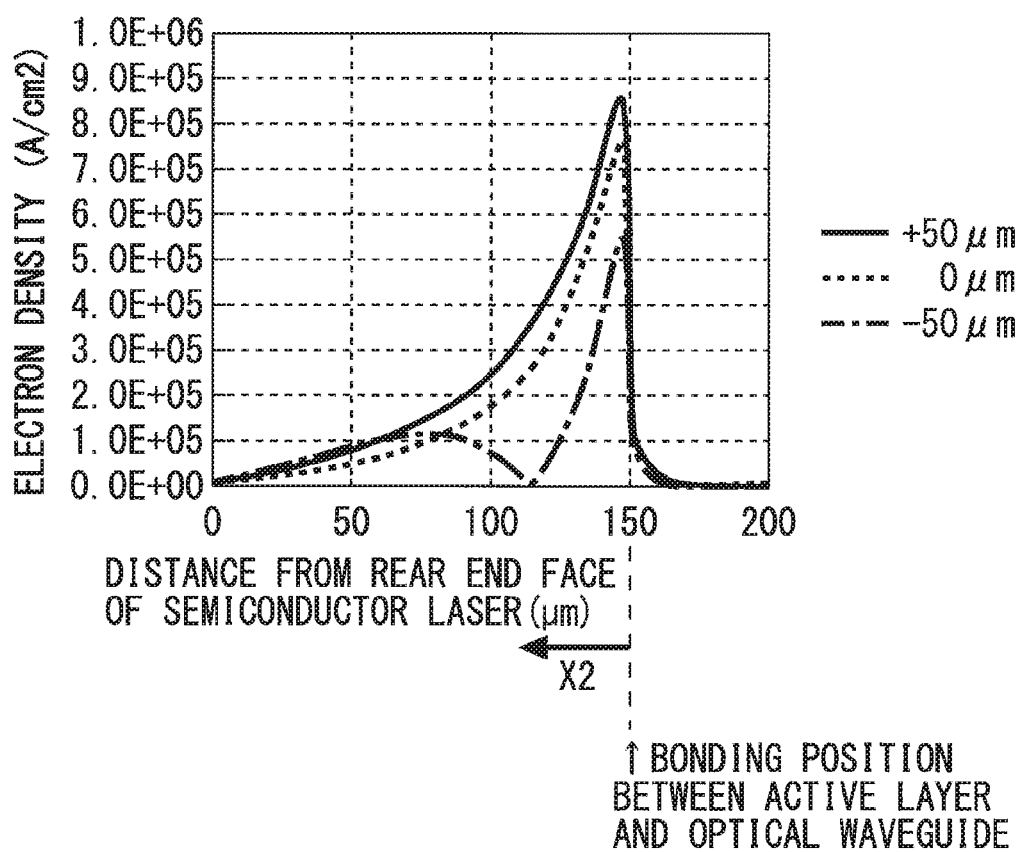
FIG. 14 is a graph showing the calculated results of the relationship between the distance from a rear end face of the semiconductor laser and the electron density.

FIG. 14 is a graph showing the calculated results of the relationship between the distance from a rear end face of the semiconductor laser and the electron density. The conventional structure has a distance X2 of +50 µm, while Embodiment 1 has a distance of −50 µm. The electron density inside the active layer 5 in Embodiment 1 is reduced to about 50% of that of the conventional structure. Deterioration of characteristics can thus be prevented by this suppression of a rise in the electron density.

If the non-carrier-injection region X2 is not provided near the optical waveguide 3 so that the entire surface of the semiconductor laser 2 is the carrier injection region X1, the electric field will spread as far as to below the optical waveguide 3. Electrons will then be diverted from beneath the optical waveguide 3 to the carrier injection region X1 side of the active layer 5, and the above effects cannot be achieved.

Moreover, the n-type InP substrate 1 has a flat lower surface continuous over the semiconductor laser 2 and the optical waveguide 3 in this embodiment. This allows easy production of the optical semiconductor device.

Embodiment 2

Figure 15:
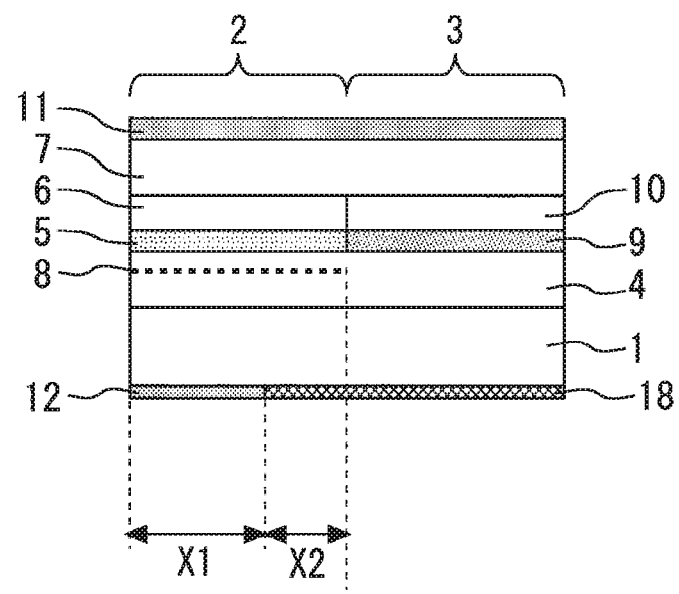
FIG. 15 is a cross-sectional view illustrating an optical semiconductor device according to Embodiment 2 of the present invention.
Figure 16:
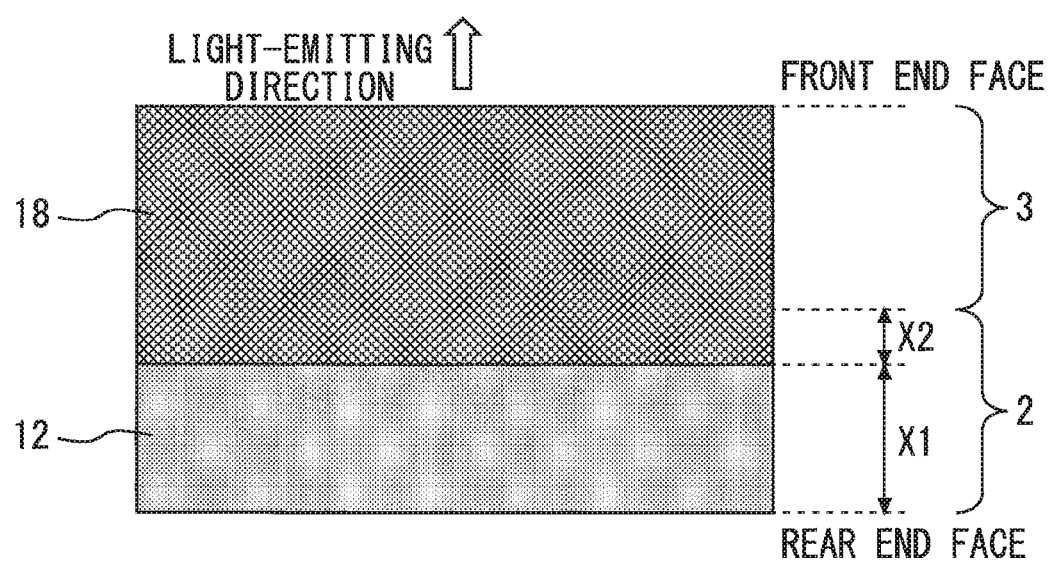
FIG. 16 is a bottom view illustrating the optical semiconductor device according to Embodiment 2 of the present invention.

FIG. 15 is a cross-sectional view illustrating an optical semiconductor device according to Embodiment 2 of the present invention. FIG. 16 is a bottom view illustrating the optical semiconductor device according to Embodiment 2 of the present invention. An insulator 18 is provided on the lower surface of the n-type InP substrate 1 in the non-carrier-injection region X2 and the optical waveguide 3 where the n-type electrode 12 is not provided. For example, after forming the insulator 18 such as SiO$_2$ on the entire lower surface of the n-type InP substrate 1, part of the insulator 18 is removed by ion milling or the like, using a locally formed resist as a mask.

When the lower surface of the optical semiconductor device is bonded to a package with a conductive bonding material such as solder, in Embodiment 1, there is a possibility that current flows between the exposed lower surface of the n-type InP substrate 1 and the bonding material, which inhibits sufficient control of the flow of injected electrons. Therefore, in this embodiment, the insulator 18 is provided on the lower surface of the device in the non-carrier-injection region X2 and the optical waveguide 3. The provision of the insulator 18 allows for reliable suppression of the flow of electrons from the non-carrier-injection region X2 and the optical waveguide 3 into the active layer 5. Accordingly, the unevenness of carrier density in the active layer 5 is reduced and the characteristics can be improved.

Figure 17:
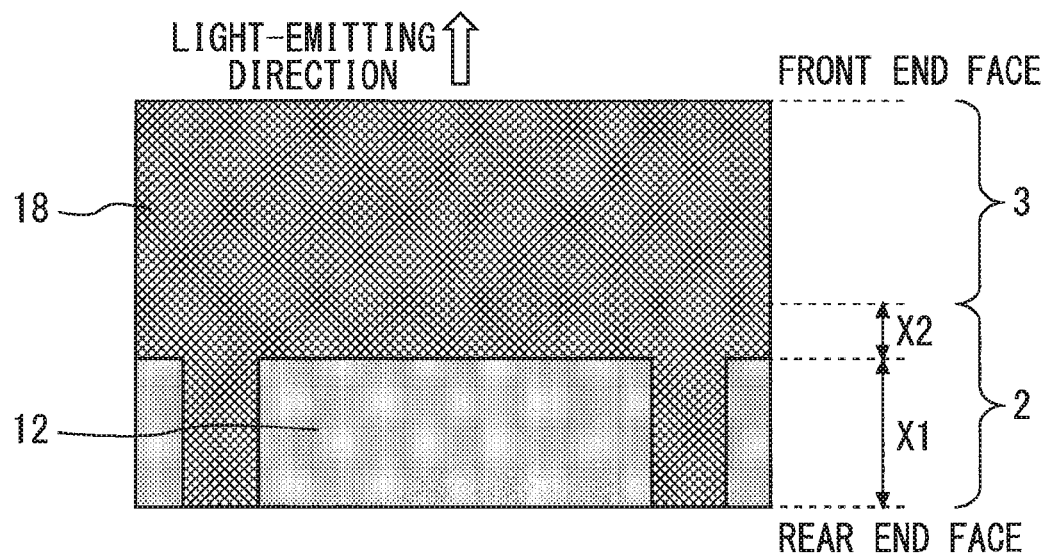
FIG. 17 is a bottom view illustrating a variation example of the optical semiconductor device according to Embodiment 2 of the present invention.

FIG. 17 is a bottom view illustrating a variation example of the optical semiconductor device according to Embodiment 2 of the present invention. Insofar as the effect of suppressing injection of carriers is not hindered, the n-type electrode 12 and insulator 18 on the lower surface of the substrate may have such a shape as shown in FIG. 17, which takes into consideration the strength with which the optical semiconductor device is fixed to the package, and heat dissipation properties. This way, tilting of the chip in the up and down direction of the drawing, which is caused by a step created between the patterns on the backside of the chip, can be reduced. Ibis applies also to Embodiments 3 to 6 to be described later.

Embodiment 3

Figure 18:
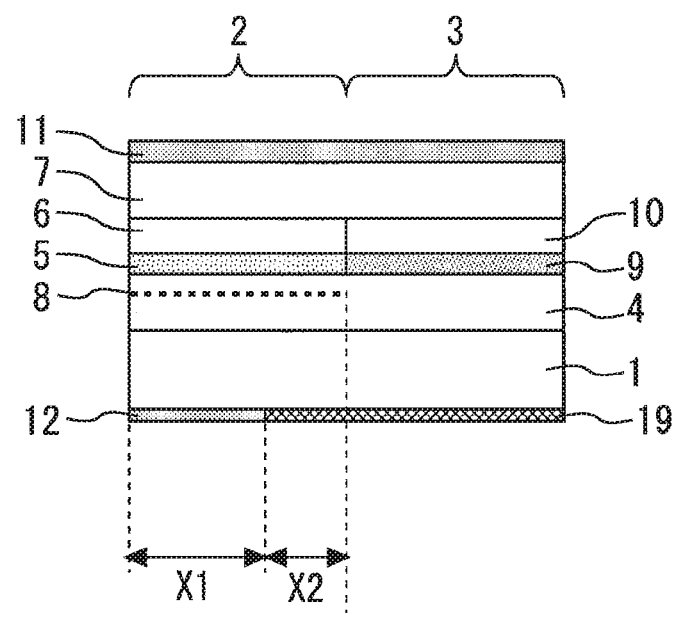
FIG. 18 is a cross-sectional view illustrating an optical semiconductor device according to Embodiment 3 of the present invention.

FIG. 18 is a cross-sectional view illustrating an optical semiconductor device according to Embodiment 3 of the present invention. A metal oxide film 19 is provided on the lower surface of the n-type InP substrate 1 in the non-carrier-injection region X2 and the optical waveguide 3 where the n-type electrode 12 is not provided. The metal oxide film 19 is locally formed, for example, by forming a metal film such as Ti on the entire lower surface of the n-type InP substrate 1, covering the carrier injection region X1 of the metal film by an insulating film or the like, and thermally or anodically oxidizing the metal layer part exposed on the surface.

When the lower surface of the optical semiconductor device is bonded to a package with a conductive bonding material such as solder, a sufficient bonding strength cannot be achieved if the device has an oxidized layer such as SiO$_2$ on the lower surface. Therefore, in this embodiment, the metal oxide film 19 is provided on the lower surface of the device in the non-carrier-injection region X2 and the optical waveguide 3. The provision of the metal oxide film 19 allows for reliable suppression of the flow of electrons from the non-carrier-injection region X2 and the optical waveguide 3 into the active layer 5. Thus, while securing bonding strength, unevenness of carrier density in the active layer 5 is suppressed, whereby characteristics can be improved.

Embodiment 4

Figure 19:
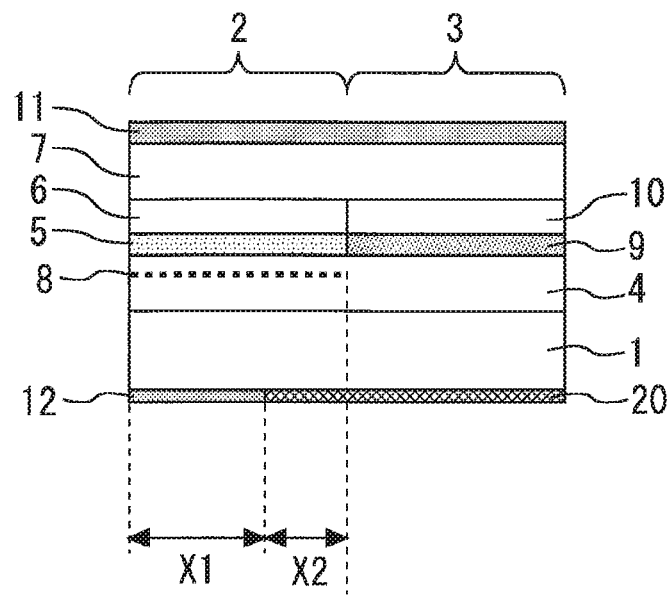
FIG. 19 is a cross-sectional view illustrating an optical semiconductor device according to Embodiment 4 of the present invention.

FIG. 19 is a cross-sectional view illustrating an optical semiconductor device according to Embodiment 4 of the present invention. A metal layer 20 Schottky-bonded to the lower surface of the n-type InP substrate 1 is provided in the non-carrier-injection region X2 and the optical waveguide 3 where the n-type electrode 12 is not provided. The metal layer 20 is made of a material containing Zn, for example. After forming the metal layer 20 on the entire lower surface of the n-type InP substrate 1, for example, part of the metal layer 20 is removed by ion milling or the like, using a locally formed resist as a mask.

When the lower surface of the optical semiconductor device is bonded to a package with a conductive bonding material such as solder, a sufficient bonding strength cannot be achieved if the lower surface of the device is not in a surface condition fit for the bonding in the non-carrier-injection region X2 and the optical waveguide 3. Therefore, in this embodiment, the metal layer 20 is provided on the lower surface of the device in the non-carrier-injection region X2 and the optical waveguide 3. The Schottky barrier junction provides a high resistance between the n-type InP substrate 1 and the metal layer 20, so that the flow of electrons from the non-carrier-injection region X2 and the optical waveguide 3 into the active layer 5 can be reliably suppressed. Thus, while securing bonding strength, unevenness of carrier density in the active layer 5 is suppressed, whereby characteristics can be improved.

Embodiment 5

Figure 20:
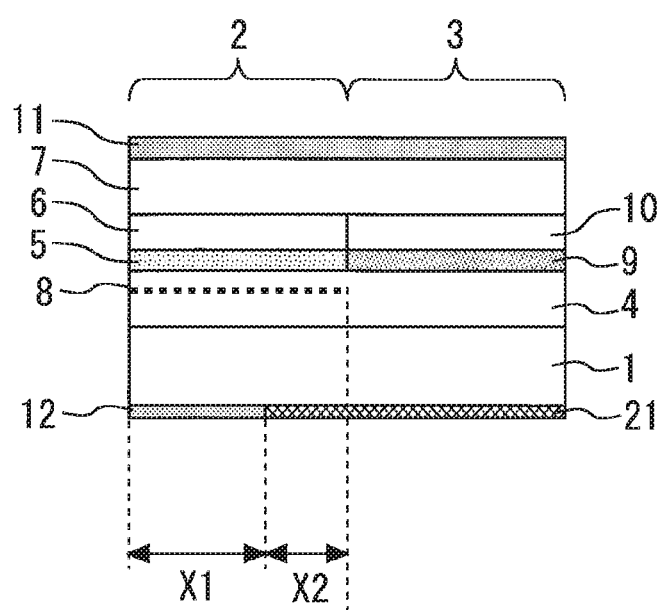
FIG. 20 is a cross-sectional view illustrating an optical semiconductor device according to Embodiment 5 of the present invention.

FIG. 20 is a cross-sectional view illustrating an optical semiconductor device according to Embodiment 5 of the present invention. A p-type semiconductor layer 21 is provided on the lower surface of the n-type InP substrate 1 in the non-carrier-injection region X2 and the optical waveguide 3. The p-type semiconductor layer 21 is formed, for example, by locally forming a layer of a diffusion source for ZnO or the like on the lower surface of the n-type InP substrate 1 and performing a thermal process to cause solid-phase diffusion of Zn from this layer.

The provision of the p-type semiconductor layer 21 allows for reliable suppression of the flow of electrons from the non-carrier-injection region X2 and the optical waveguide 3 into the active layer 5. Thus, unevenness of carrier density in the active layer 5 is suppressed, whereby characteristics can be improved. Moreover, as compared to the metal layer 20, the use of the p-type semiconductor layer 21 allows a high resistance to be achieved without relying on the material.

Embodiment 6

Figure 21:
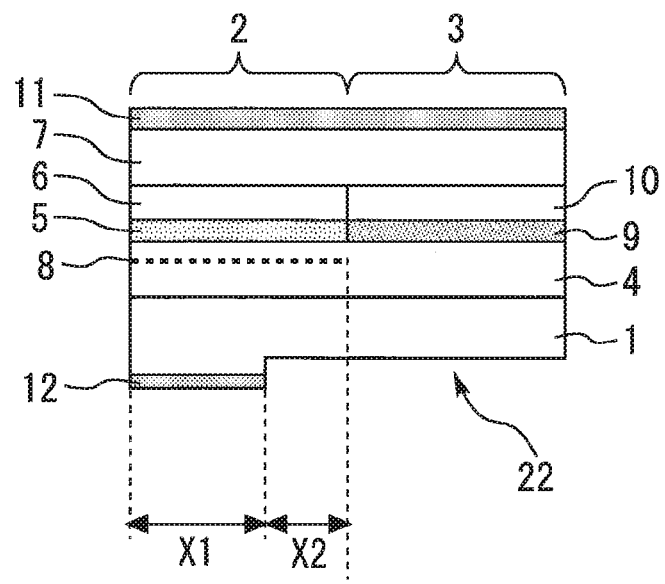
FIG. 21 is a cross-sectional view illustrating an optical semiconductor device according to Embodiment 6 of the present invention.

FIG. 21 is a cross-sectional view illustrating an optical semiconductor device according to Embodiment 6 of the present invention. Part of the n-type InP substrate 1 is removed in the thickness direction in the non-carrier-injection region X2 and the optical waveguide 3 where the n-type electrode 12 is not provided, so that a recess 22 is formed in the lower surface of the n-type InP substrate 1. For example, part of the n-type InP substrate 1 is removed by ion milling or the like, using a locally formed resist as a mask.

In the structure of Embodiment 1, the lower surface of the n-type InP substrate 1 in the non-carrier-injection region X2 and the optical waveguide 3 may sometimes contact the package, causing electrons to be injected. Forming the recess 22 separates the substrate surface from the package so that electron injection in the thickness direction in the non-carrier-injection region X2 and the optical waveguide 3 is reliably suppressed, whereby unevenness of carrier density in the active layer 5 is suppressed and characteristics can be improved. Other configurations and effects are the same as those of Embodiment 1.

Embodiment 7

Figure 22:
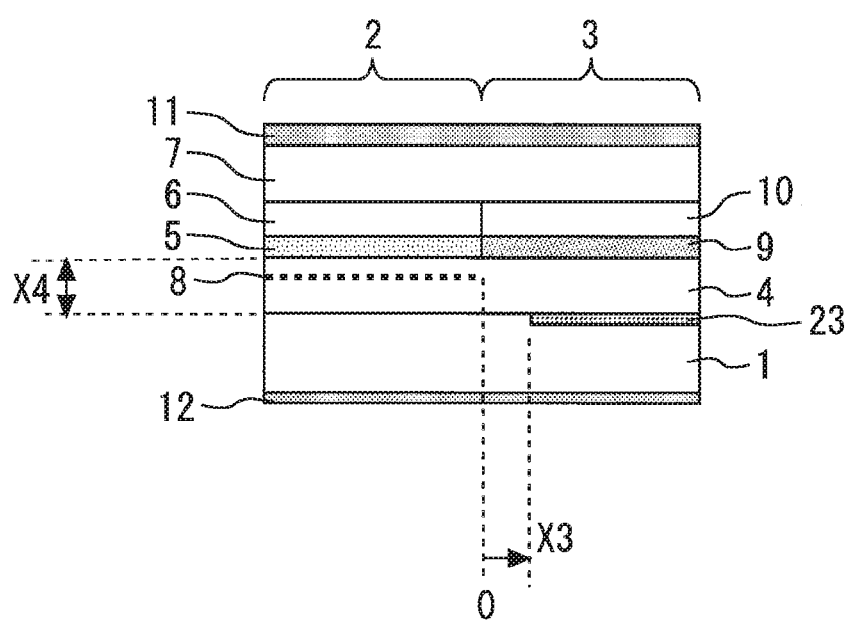
FIG. 22 is a cross-sectional view illustrating an optical semiconductor device according to Embodiment 7 of the present invention.

FIG. 22 is a cross-sectional view illustrating an optical semiconductor device according to Embodiment 7 of the present invention. Unlike Embodiment 1, the n-type electrode 12 is provided on the entire lower surface of the n-type InP substrate 1. The optical waveguide 3 includes a p-type semiconductor layer 23 that is provided below the core layer 9 and does not contact the lower surface of the n-type InP substrate 1. The distal end of the p-type semiconductor layer 23 on the side facing the semiconductor laser 2 is spaced from the butt-joint by a distance X3. This distance X3 should preferably be in the range of from 0 μm to 2 μm, the optical waveguide 3 side being the plus side, and the semiconductor laser 2 side being the minus side. The distance X4 from the upper surface of the p-type semiconductor layer 23 to the lower surface of the active layer 5 should preferably be in the range of −3 μm to −5 μm. These distances X3 and X4 are set in consideration of the effects of controlling the injection of electrons. For example, the p-type semiconductor layer 23 may be locally and selectively grown before the growth of the core layer 9. The p-type semiconductor layer 23 may also be formed by solid-phase diffusion of Zn as with Embodiment 4.

The p-type semiconductor layer 23 provided below the core layer 9 can suppress injection of electrons from the optical waveguide 3 into the active layer 5. Thus, unevenness of carrier density in the active layer 5 is suppressed and characteristics can be improved. Moreover, provision of the p-type semiconductor layer 23 as an internal structure that does not contact the lower surface of the n-type InP substrate 1 can prevent a decline in the bonding strength with the package and characteristic deterioration caused by a thermal stress distribution in the optical semiconductor device.

The distal end of the p-type semiconductor layer 23 on the side facing the semiconductor laser 2 should preferably coincide with the butt-joint, i.e., X3=0 μm. If, however, the p-type semiconductor layer 23 extends as far as to below the active layer 5 of the semiconductor laser 2, the electron density of the active layer 5 will rise locally.

Figure 23:
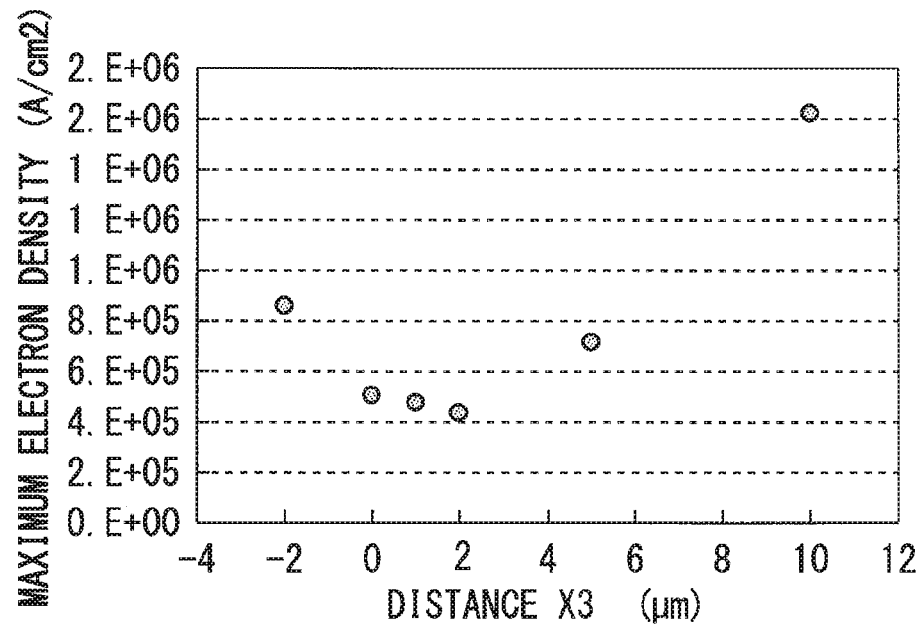
FIG. 23 is a graph showing the calculated results of the relationship between the distance X3 and the maximum electron density.
Figure 24:
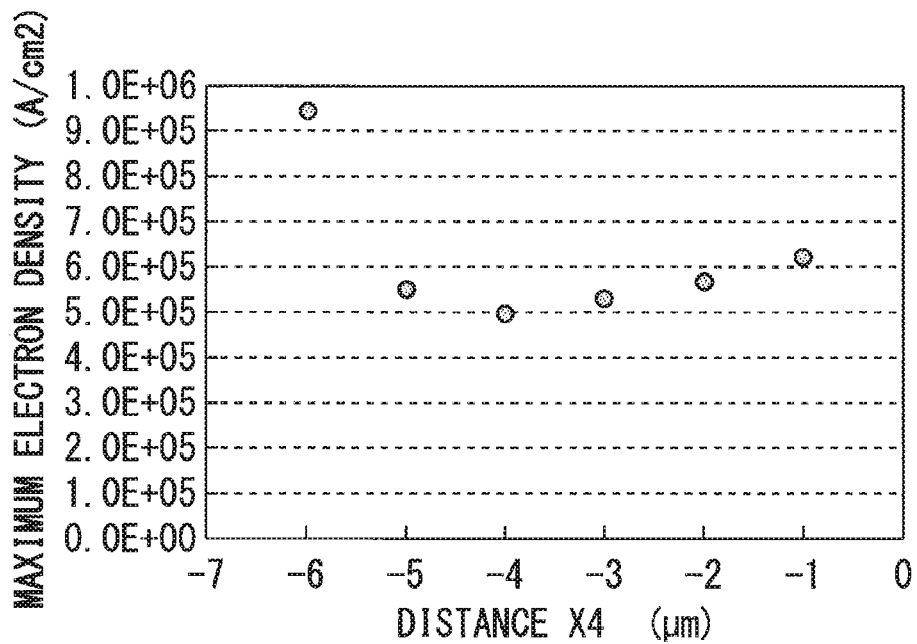
FIG. 24 is a graph showing the calculated results of the relationship between the distance X4 and the maximum electron density.

FIG. 23 is a graph showing the calculated results of the relationship between the distance X3 and the maximum electron density. FIG. 24 is a graph showing the calculated results of the relationship between the distance X4 and the maximum electron density. Maximum values of electron density in the active layer 5 and the locations are shown in each graph similarly to FIG. 14. These graphs indicate that the maximum value of electron density can be reduced to about 50% of conventional structures according to this embodiment. Thus deterioration of characteristics can be prevented.

Figure 25:
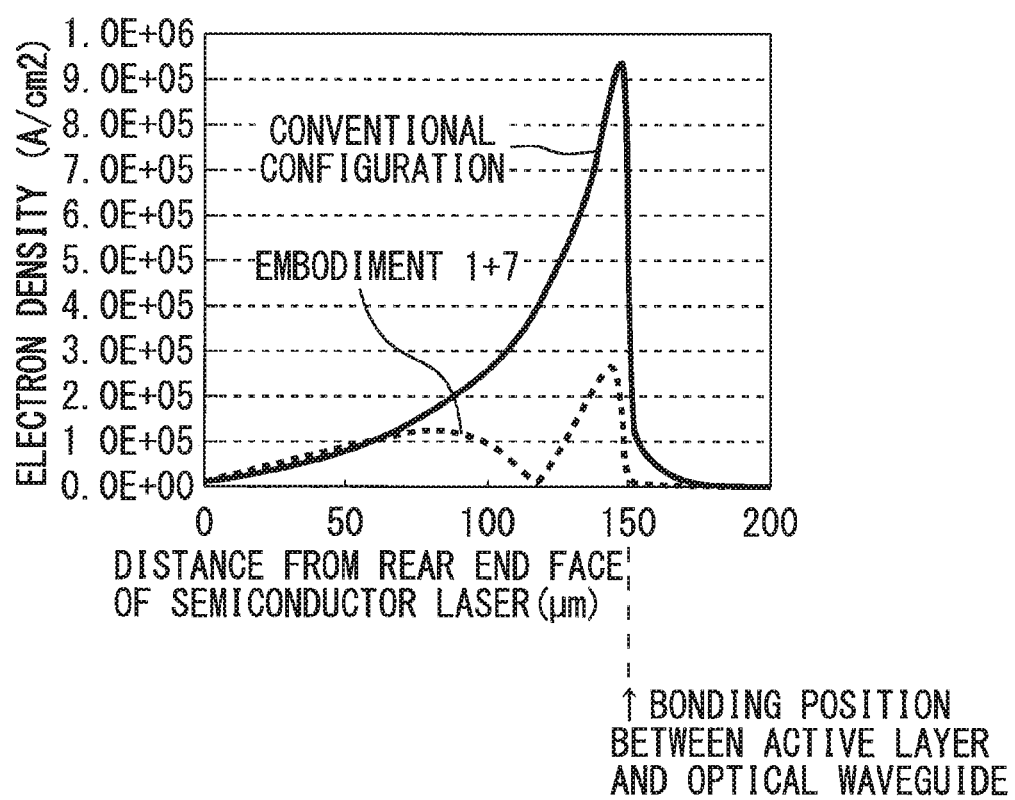
FIG. 25 is a graph showing the difference in effects between Embodiments 1 and 7 of the present invention and a conventional configuration.

The semiconductor optical devices according to Embodiments 1 to 7 are an optical waveguide-integrated, semiconductor optical device having a semiconductor laser 2 and an optical waveguide 3 integrated therein. The present invention is not limited to this. The configurations according to Embodiments 1 to 7 can also be combined with a structure including an optical active device such as an optical modulator or an optical amplifier, and an optical waveguide integrated side by side. The manufacturing method and materials to be used are not limited to those shown in Embodiments 1 to 7 above and other configurations and manufacturing methods can be applied as long as similar effects are achieved. The configurations of Embodiments 1 to 7, for example, of Embodiment 1 and Embodiment 7, can be effectively combined. FIG. 25 is a graph showing the difference in effects between Embodiments 1 and 7 of the present invention and a conventional configuration. As shown, the combination of Embodiments 1 and 7 is highly effective as the maximum value of electron density can be reduced to about 30% of the conventional structure.

While the p-type electrode 11 is formed on the entire upper surface of the conductive InP layer 7 of the optical semiconductor device, this may not necessarily be so and the electrode may be formed to only part of the conductive InP layer 7 in so far as the effects achieved by the present invention are not affected. Further, in the structures of Embodiments 2 to 5 wherein there is a region on the underside of the substrate where no effective carrier injection is performed from the n-type electrode 12, an n-type electrode 12 may be formed in this region insofar as the effects of the present invention are not hindered.

While examples of structures were shown in Embodiments 1 to 7 wherein current blocking layers are buried on both sides of the mesa stripe geometry, the present invention is not limited to these and can be applied to ridge-shaped structures that do not use current blocking layers.

REFERENCE SIGNS LIST 1 n-type semiconductor substrate; 2 semiconductor laser; 3 optical waveguide; 4 n-type cladding layer; 5 active layer; 6 p-type cladding layer; 9 core layer; 10 cladding layer; 12 n-type electrode; 18 insulator; 19 metal oxide film; 20 metal layer; 21,23 p-type semiconductor layer; 22 recess; X1 carrier-injection region; X2 non-carrier-injection region

The invention claimed is:
1. An optical semiconductor device comprising:
a semiconductor laser including an n-type semiconductor substrate, a stack of an n-type cladding layer, an active layer, and a p-type cladding layer successively stacked on the n-type semiconductor substrate; and
an optical waveguide including a non-impurity-doped core layer provided on a light output side of the semiconductor laser on the n-type semiconductor substrate and having a larger forbidden band width than the active layer, and a cladding layer provided on the core layer and having a lower carrier concentration than the p-type cladding layer,
wherein the semiconductor laser includes a carrier injection region, and a non-carrier-injection region provided between the carrier injection region and the optical waveguide.
2. The optical semiconductor device according to claim 1, further comprising an electrode provided in the carrier injection region on a lower surface of the n-type semicon- ductor substrate and not provided in the non-carrier-injection region and the optical waveguide.

3. The optical semiconductor device according to claim 1, further comprising an insulator provided on a lower surface of the n-type semiconductor substrate in the non-carrier-injection region and the optical waveguide.

4. The optical semiconductor device according to claim 1, further comprising a metal oxide film provided on a lower surface of the n-type semiconductor substrate in the non-carrier-injection region and the optical waveguide.

5. The optical semiconductor device according to claim 1, further comprising a metal layer Schottky-bonded to a lower surface of the n-type semiconductor substrate in the non-carrier-injection region and the optical waveguide.

6. The optical semiconductor device according to claim 1, further comprising a p-type semiconductor layer provided on a lower surface of the n-type semiconductor substrate in the non-carrier-injection region and the optical waveguide.

7. The optical semiconductor device according to claim 1, wherein a lower surface of the n-type semiconductor substrate is flat in the semiconductor laser and the optical waveguide.

8. The optical semiconductor device according to claim 1, wherein a recess is formed in the lower surface of the n-type semiconductor substrate in the non-carrier-injection region and the optical waveguide.

9. An optical semiconductor device comprising:

a semiconductor laser including an n-type semiconductor substrate, a stack of an n-type cladding layer, an active layer, and a p-type cladding layer successively stacked on the n-type semiconductor substrate; and an optical waveguide including a non-impurity-doped core layer provided on a light output side of the semiconductor laser on the n-type semiconductor substrate and having a larger forbidden band width than the active layer, a cladding layer provided on the core layer and having a lower carrier concentration than the p-type cladding layer, and a p-type semiconductor layer provided below the core layer and not in contact with a lower surface of the n-type semiconductor substrate.

* * * * *